(12) United States Patent
Lee

(10) Patent No.: US 7,151,712 B1
(45) Date of Patent: Dec. 19, 2006

(54) ROW DECODER WITH LOW GATE INDUCE DRAIN LEAKAGE CURRENT

(75) Inventor: Cheng-Sheng Lee, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 11/163,436

(22) Filed: Oct. 19, 2005

(51) Int. Cl.
*G11C 8/00* (2006.01)

(52) U.S. Cl. ............... 365/230.06; 365/189.09; 365/230.08

(58) Field of Classification Search ............ 365/230.06
See application file for complete search history.

(56) References Cited

U.S. PATENT DOCUMENTS

| | | | |
|---|---|---|---|
| 5,265,052 A | * 11/1993 | D'Arrigo et al. ...... | 365/185.23 |
| 5,703,825 A | * 12/1997 | Akiba et al. ............ | 365/229 |
| 5,870,348 A | * 2/1999 | Tomishima et al. .... | 365/230.06 |
| 6,512,705 B1 | 1/2003 | Koelling et al. ....... | 365/189.11 |
| 6,795,348 B1 | * 9/2004 | Mihnea et al. ......... | 365/185.29 |

* cited by examiner

*Primary Examiner*—Son L. Mai
(74) *Attorney, Agent, or Firm*—Jianq Chyun IP Office

(57) ABSTRACT

A row decoder with low gate induce drain leakage current (GIDL) comprising a CMOS circuit is provided. The CMOS circuit comprises a first NMOS transistor and a first PMOS transistor. The row decoder of the present invention further comprises a second PMOS transistor and a local voltage generator. Wherein, a first source/drain of the second PMOS transistor is electrically coupled to a base of the first PMOS transistor, and a second source/drain of the second PMOS transistor is electrically coupled to a base thereof and a DC bias. Moreover, the local voltage generator provides a voltage signal to a gate of the second PMOS transistor, which controls the second PMOS transistor to work in conductive, partial conductive or open circuit mode.

6 Claims, 5 Drawing Sheets

ROW DECODER WITH LOW GATE INDUCE DRAIN LEAKAGE CURRENT

BACKGROUND OF THE INVENTION

1. Field of the Invention

The present invention relates to a technique for reducing the gate induce drain leakage (GIDL), and more particularly, to a row decoder with the low gate induce drain leakage current (GIDL) used in the memory apparatus.

2. Description of the Related Art

FIG. 1 schematically shows a circuit diagram of a conventional row decoder used in a memory apparatus. Referring to FIG. 1, the conventional row decoder comprises a CMOS switch circuit and the CMOS switch circuit comprises two transistors 201 and 203. Wherein, the transistor 201 is a PMOS transistor and the transistor 203 is an NMOS transistor. The drain of the transistors 201 and 203 are jointly coupled to a word line WL; the gate of the transistors 201 and 203 are jointly coupled to a selection signal SEL. In addition, a source of the transistor 201 is electrically coupled to a word line driving voltage $V_{WL}$, a base of the transistor 201 is electrically coupled to a DC bias $V_{PP}$, and a source of the transistor 203 is electrically coupled to a DC bias $V_{NN}$ and a base of the transistor 203. Wherein, the DC bias $V_{PP}$ is greater than $V_{NN}$.

Moreover, an NMOS transistor 205 is further disposed in the conventional row decoder. Wherein, a source and a drain of a transistor 205 are electrically coupled to the source and the drain of the transistor 203 respectively, and a base of the transistor 205 is electrically coupled to the source of the transistor 205. Furthermore, a gate of the transistor 205 is electrically coupled to a word line reset signal WLRST.

When the memory apparatus desires to drive the word line WL, the selection signal SEL is pulled down to a low level, so as to turn on the transistor 201 and turn off the transistor 203. Meanwhile, the word line driving voltage $V_{WL}$ is conducted from the source to the drain, and further to the word line WL by the transistor 201. On the contrary, when the word line WL is not selected by the memory apparatus, the selection signal SEL is pulled up to a high level, so as to turn off the transistor 201 and turn on the transistor 203. Meanwhile, the word line WL is turned off.

Theoretically, when the word line WL is turned off, there should be no current on the word line WL. However, it is not true in the real case. Since the deep submicron technique is continuously developed, the size of the MOS component is becoming smaller and smaller. When the word line WL is turned off, the selection signal SEL on the gate of the transistor 201 is in the high level, which causes a leakage current on the drain flowing to the base. This is the so-called "gate induce drain leakage current (GIDL)". The GIDL may cause the incomplete turn off of the word line WL, which results in the operation errors.

In order to resolve the GIDL problem, U.S. Pat. No. 6,512,705 disclosed by Jeff Koelling et al. was published in the Micron Technique & Technology in 2003. In the U.S. Pat. No. 6,512,705, a word line driving circuit shown in FIG. 2 was disclosed. In accordance with the technique disclosed in the patent mentioned above, the NMOS transistors 62, 64 and 66 are electrically coupled to the source of the PMOS transistors 46, 48 and 52 respectively, and a local voltage generator is configured to reduce the source voltage of the PMOS transistors 46, 48 and 52, such that the GIDL effect is reduced. The detailed operation should be easily understood by the one of the ordinary skill in the art by referring to the description of the patent.

SUMMARY OF THE INVENTION

Therefore, it is an object of the present invention to provide a row decoder with low gate induce drain leakage current (GIDL), which can reduce the impact caused by the GIDL effect while the word line is turned off.

The present invention provides a row decoder with low GIDL which comprises a first PMOS transistor and a first NMOS transistor. Wherein, a first source/drain and a gate of the first NMOS transistor are electrically coupled to a second source/drain and a gate of the first PMOS transistor, respectively. In addition, the gate of the first PMOS transistor and the first NMOS transistor jointly receive a selection signal. Moreover, the first source/drain of the first PMOS transistor is electrically coupled to a word line driving voltage, and a second source/drain of the first NMOS transistor is electrically coupled to a base of the first NMOS transistor and a first DC bias. The present invention further comprises a local voltage generator and a base control circuit. Wherein, the base control circuit, electrically coupled to a base of the first PMOS transistor, makes the base of the first PMOS transistor selectively couple to a second DC bias or float the base thereof according to a voltage signal generated by the local voltage generator. Moreover, the second DC bias is greater than the first DC bias.

In the embodiment of the present invention, the base control circuit comprises a second PMOS transistor. Wherein, a first source/drain of the second PMOS transistor is electrically coupled to the base of the first PMOS transistor, and a gate of the second PMOS transistor is electrically coupled to the local voltage generator for receiving the voltage signal. A second source/drain of the second PMOS transistor is electrically coupled to the second DC bias and a basethereof.

In addition, the local voltage generator comprises a third PMOS transistor and a second NMOS transistor. Wherein, a gate of the third PMOS transistor receives a first control signal, and a first source/drain of the third PMOS transistor is electrically coupled to a base thereof and coupled to either the second DC bias or a third DC bias. A second source/drain of the third PMOS transistor is electrically coupled to the gate of the second PMOS transistor. A first source/drain and a gate of the second NMOS transistor are electrically coupled to the second source/drain and a gate of the third PMOS transistor, respectively. Moreover, a second source/drain of the second NMOS transistor is grounded and also electrically coupled to a base thereof.

In summary, when the word line is turned off, the base control circuit selectively transmits a second voltage to the base of the first PMOS transistor or even makes the base control circuit open to float the base of the first PMOS transistor according to the voltage signal. Accordingly, the impact caused by the GIDL effect can be reduced.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
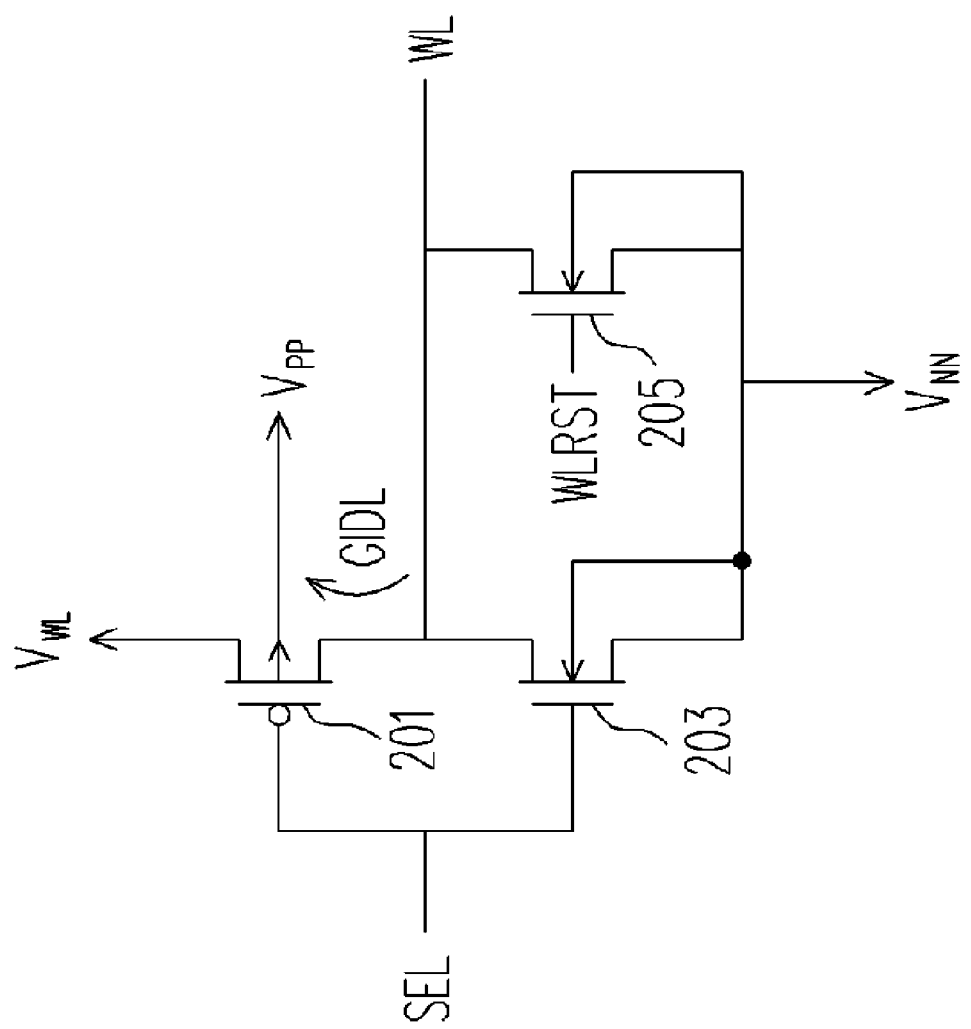
FIG. 1 schematically shows a circuit diagram of a conventional row decoder.
Figure 2:
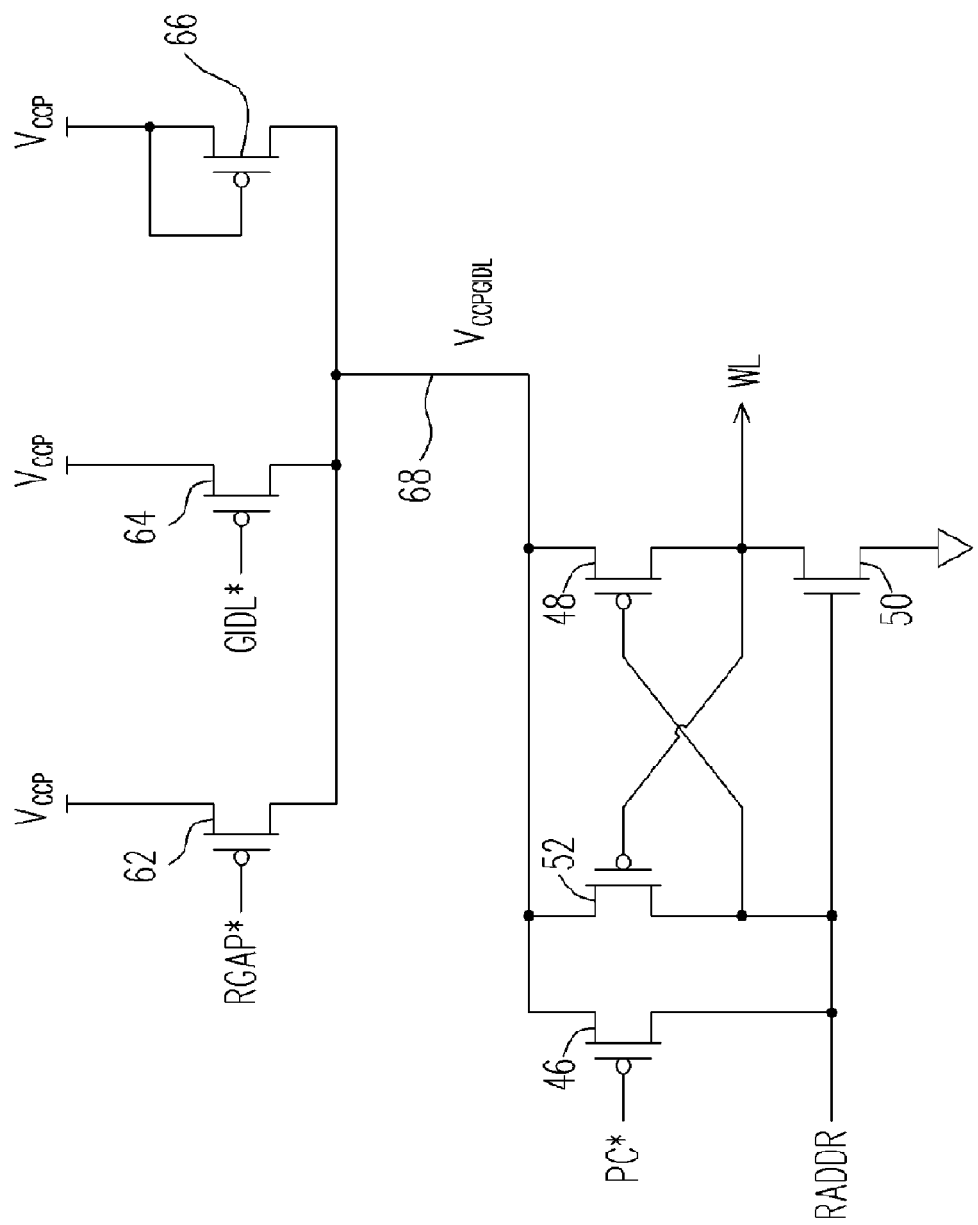
FIG. 2 schematically shows a circuit diagram of a conventional row decoder with low GIDL effect.
Figure 3:
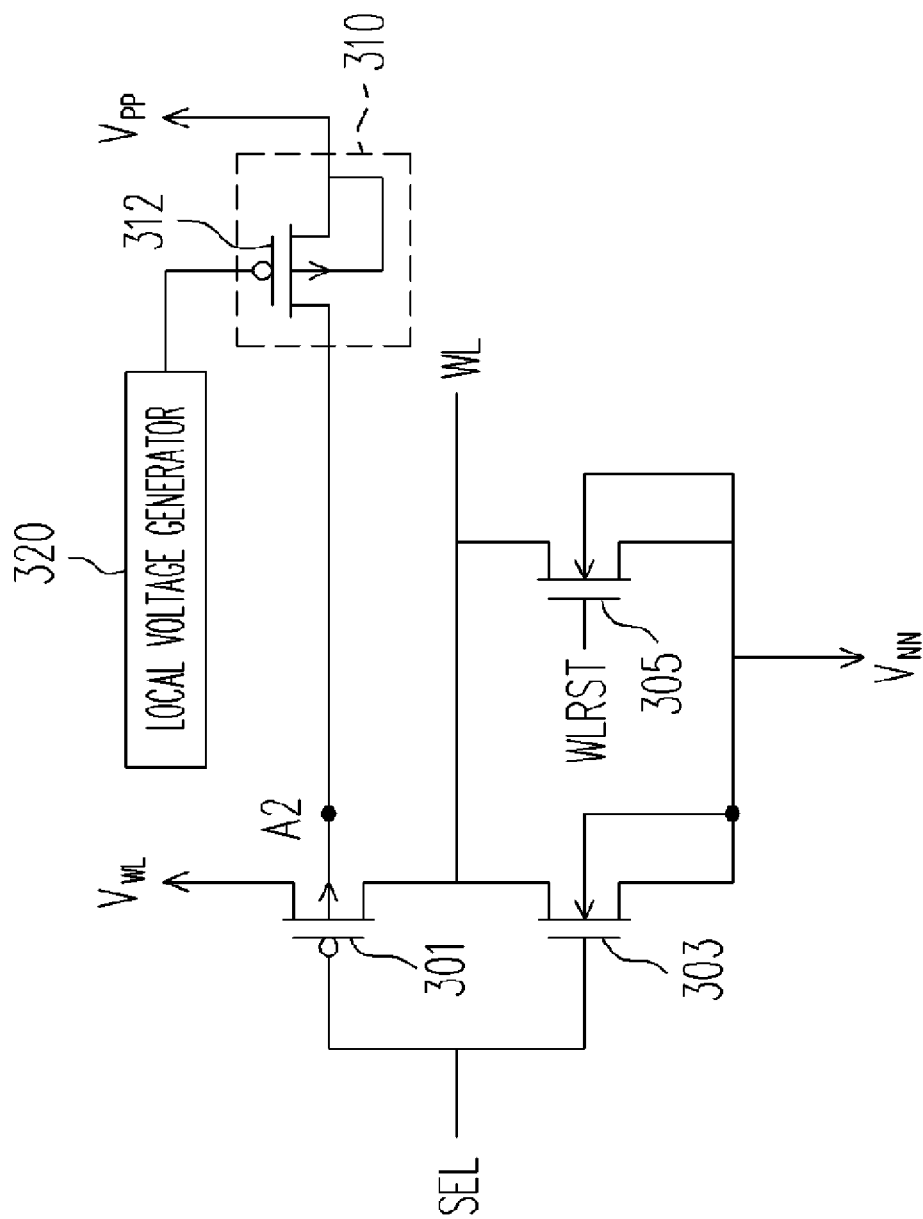
FIG. 3 schematically shows a circuit diagram of a row decoder according to a preferred embodiment of the present invention.

FIG. 3 schematically shows a circuit diagram of a row decoder according to a preferred embodiment of the present invention, wherein the row decoder is suitable for a memory apparatus, such as a dynamic random access memory (DRAM). Referring to FIG. 3, the row decoder provided by the present invention comprises a pair of transistors 301 and 303. Wherein, the transistor 301 may be a PMOS transistor, and the transistor 303 may be an NMOS transistor.

Referring to FIG. 3, a first source/drain of the transistor 301 is electrically coupled to a word line driving voltage $V_{WL}$, and a gate and a second source/drain of the transistor 301 are electrically coupled to a gate and a first source/drain of the transistor 303, respectively. Wherein, the first source/drain of the transistor 303 and the second source/drain of the transistor 301 are jointly coupled to one of the word lines WL in the memory apparatus. In addition, the gate of the transistors 301 and 303 are jointly coupled to a selection signal SEL. Moreover, a second source/drain of the transistor 303 is electrically coupled to a DC bias $V_{NN}$ and a base thereof.

Moreover, the row decoder provided by the present invention further comprises an NMOS transistor 305. Wherein, a first source/drain of the transistor 305 is electrically coupled to the word line WL, and a gate of the transistor 305 is electrically coupled to a word line reset signal WLRST. A second source/drain of the transistor 305 and transistor 303 are jointly coupled to the DC bias $V_{NN}$ and a base of the transistor 305.

Specifically, the base of the transistor 301 is electrically coupled to the base control circuit 310. Wherein, when the word line WL is turned off, the base control circuit 310 selectively couples the DC bias $V_{PP}$ to the base of the transistor 301 or transmits a part value of the DC bias $V_{PP}$ to the base of the transistor 301 according to a voltage signal generated by the local voltage generator 320. Wherein, the DC bias $V_{PP}$ is greater than the DC bias $V_{NN}$. In the present embodiment, the DC bias $V_{PP}$ may be 3.3 volts, and the DC bias $V_{NN}$ may be −0.4 volt, but not necessarily limited by it.

In another embodiment of the present invention, the base control circuit 310 can selectively couple the DC bias $V_{PP}$ to the base of the transistor 301 or make the base of the transistor 301 floating according to the voltage signal generated by the local voltage generator 320.

Preferably, the base control circuit 310 is embodied by a transistor 312. It is assumed that the transistor 312 is a PMOS transistor, and a first source/drain of the transistor 312 is electrically coupled to the base of the transistor 301. A gate of the transistor 312 is electrically coupled to the local voltage generator 320 for receiving the voltage signal. In addition, a second source/drain of the transistor 312 is electrically coupled to the DC bias $V_{PP}$ and a base thereof.

Figure 4:
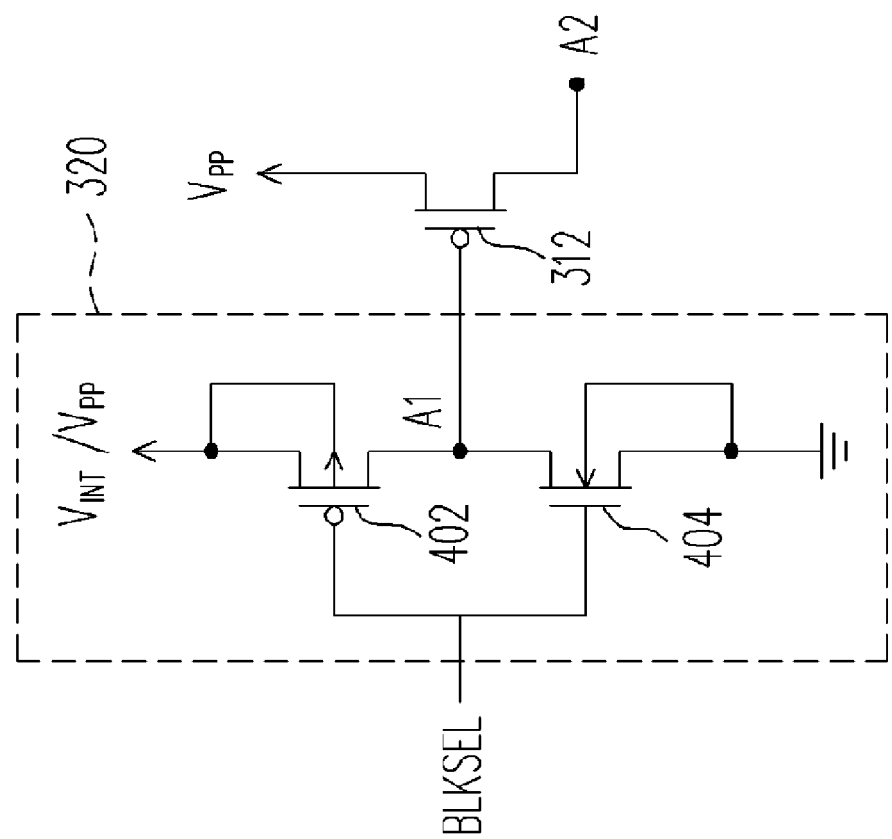
FIG. 4 schematically shows a circuit diagram of a local voltage generator according to a preferred embodiment of the present invention.

FIG. 4 schematically shows a circuit diagram of a local voltage generator according to a preferred embodiment of the present invention. In FIG. 4, the same element symbol indicates the same or similar component and also has the exact function provided by the component in FIG. 3. Referring to FIG. 4, a CMOS circuit composed of a pair of transistors 402 and 404 is included in the local voltage generator 320. Wherein, the transistor 402 may be a PMOS transistor and the transistor 404 may be an NMOS transistor.

Referring to FIG. 4, a first source/drain of the transistor 402 is electrically coupled to the DC bias $V_{PP}$ and a base thereof. A second source/drain and a gate of the transistor 402 are electrically coupled to a first source/drain and a gate of the transistor 404, respectively. Wherein, the gate of the transistors 402 and 404 are jointly coupled to a control signal BLKSEL, and the second source/drain of the transistor 402 and the first source/drain of the transistor 404 are jointly coupled to the gate of the transistor 312. Furthermore, a second source/drain of the transistor 404 is grounded and also electrically coupled to a base thereof.

Figure 5:
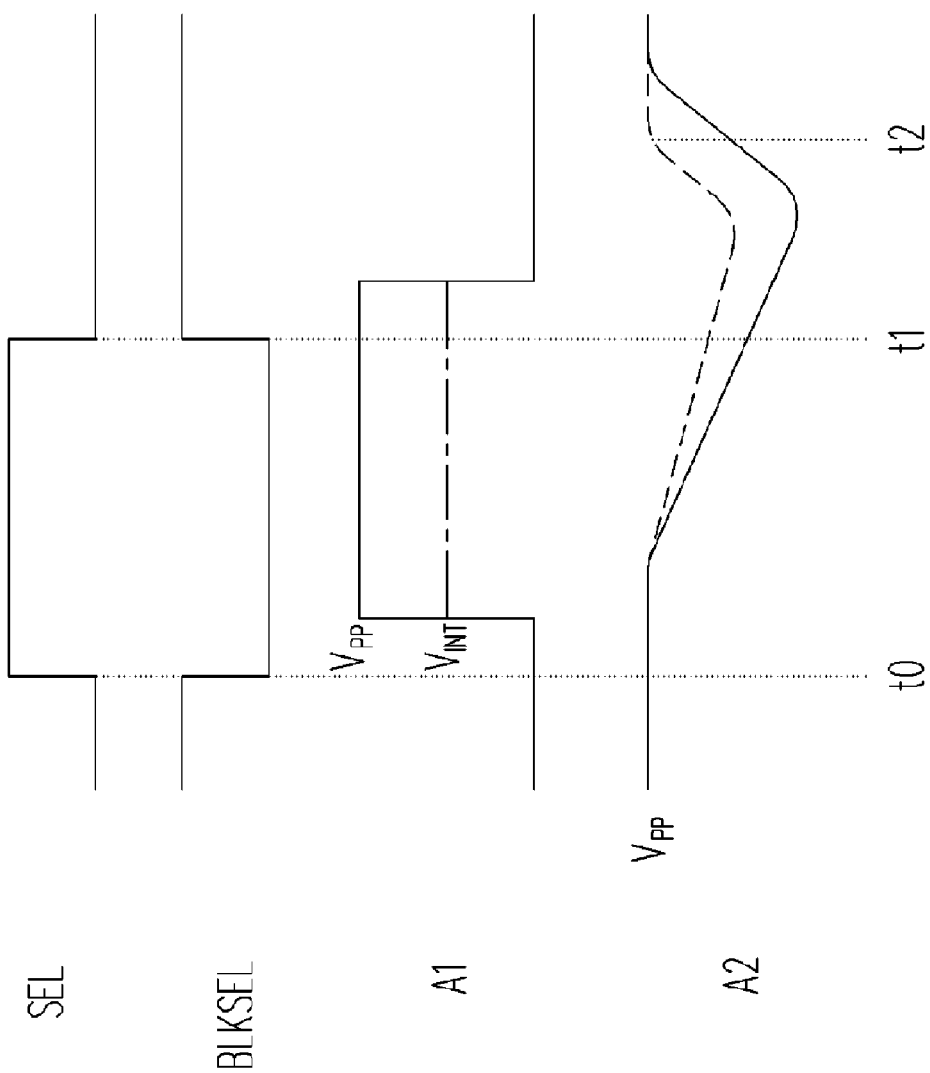
FIG. 5 schematically shows an operation timing diagram of a row decoder according to a preferred embodiment of the present invention.

FIG. 5 schematically shows an operation timing diagram of a row decoder according to a preferred embodiment of the present invention. Referring to FIG. 3, FIG. 4, and FIG. 5, it is assumed that the memory apparatus desires to turn off the word line WL at the time point t0, thus the selection signal SEL is pulled up from a low level to a high level, so as to turn off the transistor 301 and turn on the transistor 303. Meanwhile, the control signal BLKSEL is pulled down from the high level to the low level, so as to turn on the transistor 402 and turn off the transistor 404.

When the transistor 402 is turned on, the DC bias $V_{PP}$ is provided to a node A1, and the level is pulled up from the ground level to the level of DC bias $V_{PP}$.

When the gate of the transistor 312 receives the DC bias $V_{PP}$, the transistor 312 is turned off. Meanwhile, the base A2 of the transistor 301 is floating, so as to eliminate the GIDL effect.

It is assumed that the memory apparatus desires to drive the word line WL again at the time point t1, thus the selection signal SEL is pulled down to the low level and the control signal BLKSEL is pulled up to the high level again. Meanwhile, the transistor 402 is turned off and the transistor 404 is turned on. Accordingly, the local voltage generator 320 sets the gate of the transistor 312 in the ground level, and the DC bias $V_{PP}$ is provided to the base of the transistor 301.

Although the selection signal SEL has been pulled down to the low level at the time point t1, since the base of the transistor 301 is always floating before the time point t1, a long period of time is required to charge the base of the transistor 301 to the level of DC bias $V_{PP}$, which lowers down the operating speed of the memory apparatus.

In order to increase the operating speed of the memory apparatus, another embodiment is further provided by the present invention, in which the first source/drain of the transistor 402 is electrically coupled to a DC bias $V_{INT}$. Wherein, the DC bias $V_{INT}$ is greater than $V_{NN}$ but less than $V_{PP}$. Therefore, when the control signal BLKSEL is pulled down to the low level, the local voltage generator 320 will transmit the DC bias $V_{INT}$ to the gate of the transistor 312 as the voltage signal.

Since the DC bias $V_{INT}$ is less than $V_{PP}$, the transistor 312 is not completely turned on. In other words, the transistor 312 is partially conductive. Meanwhile, the base control circuit 310 will apply a part value of the DC bias $V_{PP}$ to the base of the transistor 301. Since a small voltage is still applied on the base of the transistor 301 while the word line WL is turned off, the GIDL still occurs despite it is small. Although there is a small GIDL existed on the transistor 301 while the word line WL is turned off, the base of the transistor 301 can be quickly charged to the level of DC bias $V_{PP}$ when the word line WL is driven again; thus, the operating speed of the memory apparatus is improved.

In summary, in the row decoder of the present invention, since the local voltage generator generates different level voltage signals, the transistor in the base control circuit can work in conductive, partial conductive or open status. Accordingly, the GIDL effect is reduced or totally eliminated.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A row decoder with low gate induce drain leakage current (GIDL) suitable for a memory apparatus, comprising:
    a first PMOS transistor, in which a first source/drain is electrically coupled to a word line driving voltage, and a gate receives a selection signal;
    a first NMOS transistor, in which a first source/drain and a gate are electrically coupled to a second source/drain and the gate of the first PMOS transistor respectively, and a second source/drain is electrically coupled to a base of the first NMOS transistor and a first DC bias;
    a local voltage generator for generating a voltage signal; and
    a base control circuit electrically coupled to a base of the first PMOS transistor for selectively coupling the base of the first PMOS transistor to a second DC bias, a third DC bias, or floating according to the voltage signal, wherein the third DC bias is greater than the first DC bias and less than the second DC bias.

2. The row decoder with low GIDL of claim 1, wherein the base control circuit comprises a second PMOS transistor, in which a first source/drain is electrically coupled to the base of the first PMOS transistor, a gate of the second PMOS transistor is electrically coupled to the local voltage generator for receiving the voltage signal, and a second source/drain is electrically coupled to the second DC bias and a base of the second PMOS transistor.

3. The row decoder with low GIDL of claim 2, wherein the local voltage generator comprises:
    a third PMOS transistor, in which a gate receives a first control signal, a first source/drain is electrically coupled to the second DC bias and a base of the third PMOS transistor, and a second source/drain is electrically coupled to the gate of the second PMOS transistor; and
    a second NMOS transistor, in which a first source/drain and a gate are coupled to the second source/drain and the gate of the third PMOS transistor respectively, and a second source/drain is grounded and electrically coupled to a base of the second NMOS transistor.

4. The row decoder with low GIDL of claim 2, wherein the local voltage generator comprises:
    a third PMOS transistor, in which a gate receives a first control signal, a first source/drain is electrically coupled to the third DC bias and a base of the third PMOS transistor, and a second source/drain is electrically coupled to the gate of the second PMOS transistor; and
    a second NMOS transistor, in which a first source/drain and a gate are electrically coupled to the second source/drain and the gate of the third PMOS transistor respectively, and a second source/drain is grounded and electrically coupled to a base of the second NMOS transistor.

5. The row decoder with low GIDL of claim 1, wherein the second source/drain of the first PMOS transistor is further electrically coupled to a word line.

6. The row decoder with low GIDL of claim 5, further comprising a third NMOS transistor, in which a gate receives a second control signal, a first source/drain and a second source/drain are electrically coupled to the first source/drain and the second source/drain of the first NMOS transistor respectively, and a base is electrically coupled the second source/drain of the third NMOS transistor.

* * * * *